United States Patent [19]

Picquendar

[11] 4,145,675
[45] Mar. 20, 1979

[54] CHARGED-COUPLED DEVICE FILTER

[75] Inventor: Jean-Edgar Picquendar, Paris, France

[73] Assignee: Thomson-CSF, Paris, France

[21] Appl. No.: 807,530

[22] Filed: Jun. 17, 1977

[30] Foreign Application Priority Data

Jun. 22, 1976 [FR] France .................. 76 18929

[51] Int. Cl.² .............. H03H 7/28; H01L 27/10; H03H 7/10; G11C 19/28
[52] U.S. Cl. ............... 333/165; 307/221 D; 328/167
[58] Field of Search ........ 333/70 T, 29, 70 R, 333/70 A, 28 R, 18; 364/825–826, 862; 307/303, 304, 221 R, 221 C, 221 D; 357/24; 328/167

[56] References Cited

U.S. PATENT DOCUMENTS

| 3,819,958 | 6/1974 | Gosney | 333/70 T X |
| 3,944,850 | 3/1976 | Walden | 307/221 D |
| 3,946,248 | 3/1976 | Buss | 307/304 X |

OTHER PUBLICATIONS

Smith et al. — "Programmable Bandpass Filter and Tone Generator Using Bucket-Brigade Delay Lies" in IEEE Trans. On Communications, vol. COM-22, No. 7, Jul. 1974; pp. 921-925.

Primary Examiner—Alfred E. Smith
Assistant Examiner—Marvin Nussbaum
Attorney, Agent, or Firm—Cushman, Darby & Cushman

[57] ABSTRACT

The invention relates to hybrid filters comprising a recursive part and a non-recursive part which make it possible to synthesize the filter by splitting the desired pass-band into two. It consists in using for the design of such a filter a charge-coupled device (CCD) in which these two parts are directly linked by a simple charge transfer mechanism without any other connection.

4 Claims, 3 Drawing Figures

CHARGED-COUPLED DEVICE FILTER

The present invention relates to filters using charge-coupled devices. Filters of this kind can be used in numerous electronic devices and in particular in telephone equipment, especially those using the technique of pulse code modulation (PCM).

The construction of charge-coupled devices (often described in short-hand form as CCD's or BBD's) is well known per se. A description of them is to be found in the article "Charge-coupled devices" by Gilbert F. AMELIO in the journal Scientific American, Vol. 230, No. 2, February 1974.

It is well known to use charge-coupled devices to construct filters. These filters use samples of the signal to be filtered, this signal being sampled at a frequency higher than the Nyquist frequency, which makes them akin, in particular where synthesis methods are concerned, to known digital filters. However, the samples are not digitalized so that the filter retains an important analogue character. Two methods are used to measure the value of the samples, either slotted electrodes or weighted-gain amplifiers. These methods are described in the article "Transversal filtering using charge-transfer devices" by Dennis D. Buss et al. in the journal I.E.E.E. Journal of Solid State Circuits, Vol. SC8, No. 2, April 1973.

Filters of this kind may be recursive but then require extreme precision in weighting, or non-recursive which necessitates a very large number of coefficients.

The idea has been proposed of making hybrid digital filters which combine a recursive filter and a non-recursive filter in series, making it possible to reduce both the number of coefficients and the weighting accuracy. A method of synthesizing such filters and some experimental results, are set out in an article "An algorithmic procedure for designing hybrid FIR/IIR digital filters" by M. R. Campbell et al in the journal Bell System Technical Journal, Vol. 55, No. 1, January 1976.

In accordance with the present invention, there is provided a device for filtering an input signal, which comprises:

a charge-coupled device for transferring under the control of external clock signals under two successive pluralities of electrodes, charges injected under an entry electrode;

first means for weight-adding said input signal and a first plurality of signals appearing during said transfer on the first one of said pluralities of electrodes, delivering a feed-back signal to said entry electrode; and second means for weight-adding a second plurality of signals appearing during said transfer on the second one of said pluralities of electrodes, delivering an output signal.

For a better understanding of the invention, and to show how the same may be carried into effect, reference will be made to the ensuing description and to the attached figures, among which:

Figure 1:
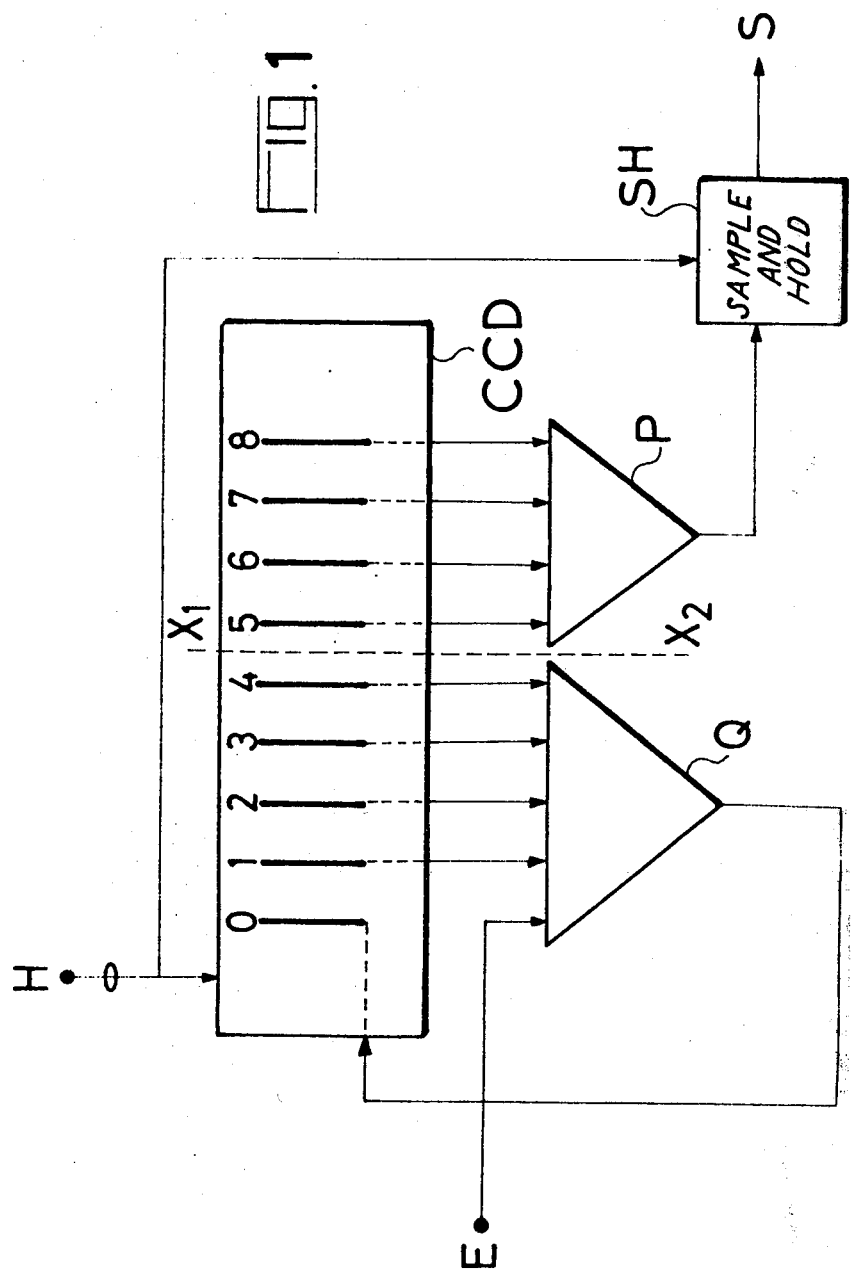
FIG. 1 illustrates a filter in accordance with the invention.

The hybrid filter shown in FIG. 1 comprises a single charge-coupled device CCD, two read-out amplifiers Q and P and a sample-and-hold-circuit SH.

The input signal, a PAM-modulated telephony signal coming from a PCM decoder for example, is applied to the input E of the read-out amplifier Q of the recursive part of the filter. Indeed, since the output of this amplifier is taken back to the input of the charge-coupled device, it is simpler, for the injection of the signal into the filter, to use an input of the amplifier which has a weighting factor of 1 rather than to include an amplifier-adder in order to add the input signal E and the output signal from Q.

The charge-coupled device has been show here in much simplified form, its operation being conventional in nature. In this example, it has nine electrodes numbered 0 to 8. Each thus marked electrode corresponds in fact to a group of two or three electrodes themselves corresponding to a complete clock cycle. The device receives the clock signals at an input H, these signals, in accordance with the relevant technology, being of two-phase or three-phase kind. The signals occur at the rate of the input PAM signal and this further simplifies the design of the filter.

In this case, the electrode O is the electrode injecting the charges into the charge-coupled device. It receives the output signal from the amplifier Q whose output stage is correspondingly designed.

The charges injected by the electrode O migrate through the charge-coupled device from this electrode to that 8 at the rate determined by the clock signals. With each transfer from one electrode to the next they develop on these electrodes voltages which are picked off by the read-out amplifiers P and Q. This explanation is deliberately schematic in nature since P and Q are in fact relatively complex pieces of circuitry which besides amplification perform the integration of the charging currents on the electrodes by a conventional method.

The voltage finally read out from each electrode is weighted by a coefficient characterized by the response curve of the filter. The assembly of coefficients is calculated by one of several available synthesizing procedures. This weighting may take place internally in the charge transfer device (slotted electrode technique) or externally by weighting each input to the read-out amplifiers.

In the illustrated example, the electrodes 1 to 4 are connected to the amplifier Q whose output is looped to the input of the electrode O. Thus, a recursive filter with four coefficients has been created.

The simple copying of a hybrid filter would lead to the use of the signal thus obtained to supply another charge-coupled device acting as a non-recursive filter, which would mean doubling the number of accessories required by the device and in particular the charge-injecting arrangement.

In the filter in accordance with the invention, by contrast a single charge-coupled device is used of which thus far the part acting as recursive filter and located to the left of the line $X_1X_2$ in the figure, has been described. The electrical charges pass directly from the electrode 4 to the electrode 5 located to the right of the line $X_1X_2$ and progress thus to the end of the charge transfer device, namely the electrode 8.

The voltages developed on the electrodes 5 to 8 are picked off by the amplifier P and weighted by coefficients appropriate to each electrode in the same manner as for the amplifier Q. These coefficients are calculated using a method of synthesis corresponding this time to non-recursive filters and the output of P is not therefore taken back to the charge-coupled device.

The output signal of the hybrid filter finally appears at the output of this amplifier P.

Since the output signal is constituted by a sequence of samples of the filtered signal, smoothing is performed by an additive low-pass filtering operation. This smoothing is quite often effected by the input impedance of the load circuit receiving the signal. In the case of the example described, in which the PAM signal applied at E is made up of pulses having a low filling ratio, the smoothing is carried out by the sample-and-hold circuit SH which receives the output signal from P and supplies to S the output signal of the overall filter.

The SH circuit is a conventional device operating under the control of at least one of the clock signals H and converts the sequence of pulses leaving P into a sequence of steps of the same height as these pulses. It corresponds, of course, to an individual response curve which is highly significant since it corresponds to a sin X/x function, also referred to as a cardinal sine function.

Under these conditions, in calculating the filter coefficients account is taken (in the synthesizing procedure) of the response curve of the SH circuit and this enables a substantial reduction in the number of coefficients because of the particularly suitable nature of this curve.

Conversely, it is possible in other cases to arrange this SH circuit at the input of the hybrid filter and not the output. A filter of this sort, not used for example as a receiving device in a PCM channel but as a transmitting device instead, would comprise a SH circuit receiving the analogue telephony signal and putting out a step signal in which the steps succeed one another at the sampling frequency. This step signal applied to the input of the amplifier Q is filtered by the charge-coupled device hybrid filter and results at the output of the amplifier P in a filtered and PAM-modulated signal which can then be applied to the input of a PCM encoder.

In certain instances, the number of coefficients to be used for the recursive part of the filter is too large so that technological problems of phase-shift, inadequate dynamic range and excessive noise are encountered. Indeed, small deviations in these parameters are highly amplified due to the negative feedback fundamentally occurring in recursive filters.

Figure 2:
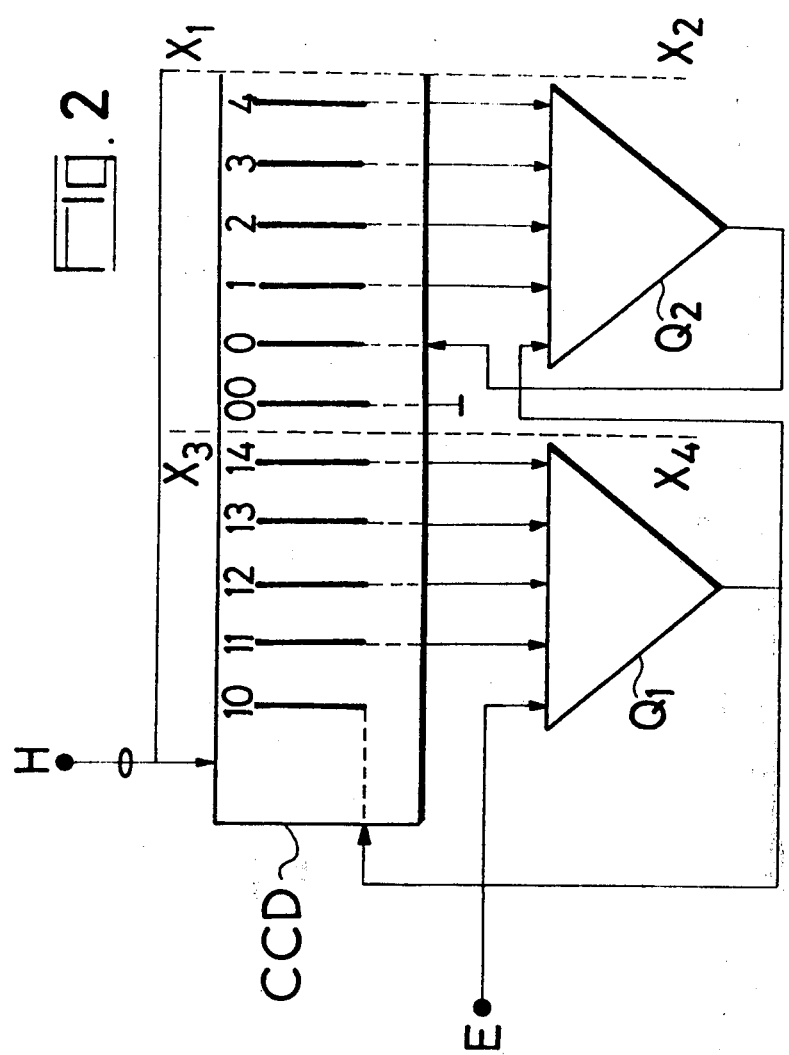
FIG. 2 illustrates the recursive part of a variant form of such a filter.

One solution here is to break the negative feedback circuit into two parts. FIG. 2 shows the application of this solution to a hybrid filter similar to that described earlier. This filter comprises eight coefficients in its recursive section whilst the non-recursive section located to the right of the line $X_1X_2$ has not been shown. The recursive part is split into two sections which in this example each comprise four coefficients and are located at either side of the line $X_3X_4$.

These two sections are completely identical to one another and similar to the part disposed to the left of the line $X_1X_2$ in FIG. 1. The differences are these:

the CCD charges coming from the electrode 14 cannot reach the electrode 0 since otherwise it would be impossible to determine where to apply the negative feedback from the amplifier Q2; therefore a supplementary electrode 00 is used which forms an output diode and enables the charges passing through the first part of the device to flow to earth.

since coupling between these two parts cannot be performed directly by the charge transfer, an external connection is provided to link the output of Q1 to the input electrode 0 of the second part; it is, of course, necessary to take this feature into account in the synthesis calculation since the value of the samples is not the same at the output of the electrode 14 as it is at the output of Q1 but this does not present any problem.

Figure 3:
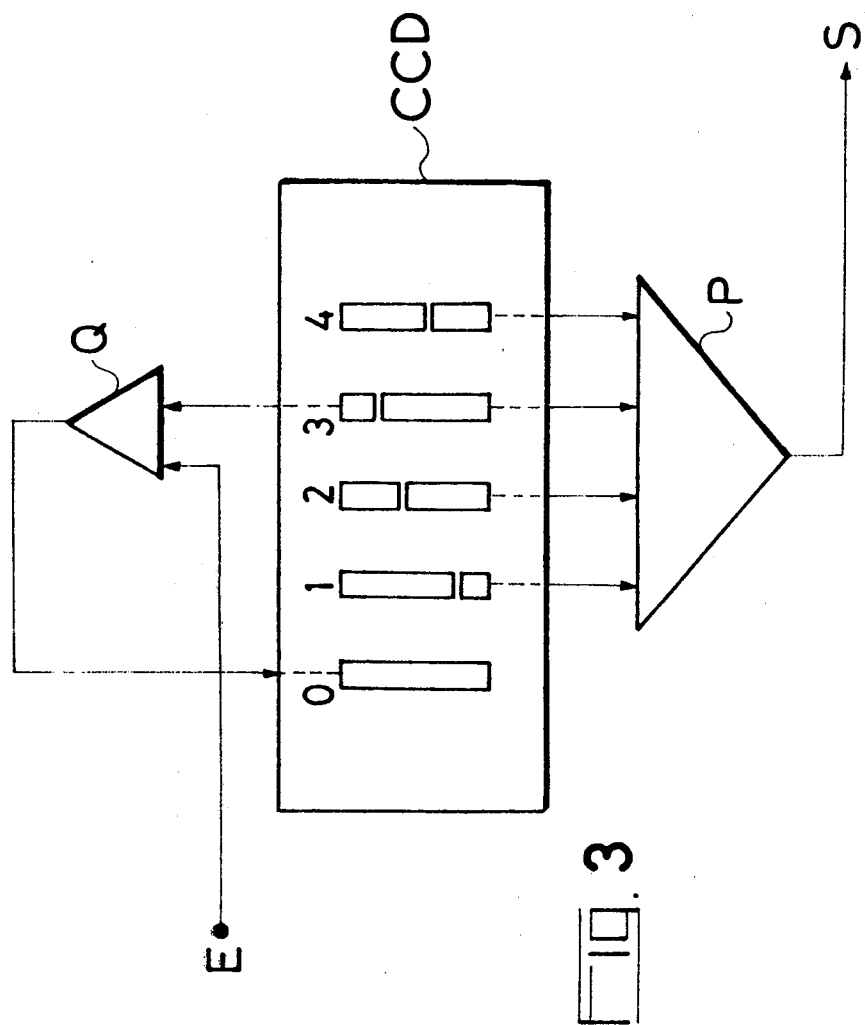
FIG. 3 illustrates a special arrangement of another filter in accordance with the invention.

In some cases the filtering requirements are sufficiently relaxed to allow the use of only one coefficient in the recursive filter. The structure of the device can then be modified in the manner shown in FIG. 3.

This figure shows a hybrid filter whose recursive part has only one coefficient and its non-recursive part four. As before, no detail of electrodes and control connections has been given but the arrangement enabling the weighting of the charges transferred beneath each electrode has been detailed.

In this instance, weighting is performed by the slotted electrode method and an example of the distribution of these slots between the electrodes 1 to 4 has been shown. The read-out amplifier P of the non-recursive part of the filter is connected to these four electrodes.

The filter input signals are applied as before to an input of the read-out amplifier of the recursive part. However, this amplifier is only connected to one of these electrodes, that 3 in the described example. In other words, in a recursive filter the parameters involved are on the one hand the negative feedback gain and on the other the negative feedback delay. In the present case the requisite delay can be selected by using the electrode corresponding to this delay. Of course, this electrode corresponds to a coefficient already used for the non-recursive part but since only one has been used anyway, it is an easy matter to obtain the requisite negative feedback gain by accurately adjusting the gain of the amplifier Q and by using an adequate input level at E, for example with the aid of an attenuator. This would affect the overall gain of the filter but is not important.

One might question whether this kind of overlap between the two parts, recursive and non-recursive, operates correctly in relation to the solution which puts them in series. The results of tests affirm that this is so, for the additional reason that since the filtering is a linear level operation it is also commutative and associative.

What I claim is:

1. A device for filtering an input signal, which comprises:
    a charge-coupled device for transferring, under the control of external clock signals, under a plurality of slotted-weight electrodes, charges injected under an entry electrode;
    means for adding said input signal, and a signal appearing on one of said electrodes during said transfer to produce a feedback signal; and
    means for adding a plurality of signals appearing on said plurality of electrodes during said transfer to produce an output signal.

2. A device for filtering an input signal comprising:
    a charge coupled device for transferring, under the control of external clock pulses, charges defining successive signals injected under an entry electrode, which injected charges are transferred under successive electrodes of a first plurality of electrodes, and then through successive electrodes of a second plurality of electrodes;
    first means for adding to said input signal weighted signals defined by charges under said electrodes of said first plurality of electrodes to produce a feedback signal, the weighting of each signal being a coefficient characterized by the response curve of the filter, and applying said feedback signal to said entry electrode; and second means for adding weighted signals defined by charges under said electrodes of said second plurality of electrodes to produce an output signal, the weighting of each signal being a coefficient corresponding to non-recursive filters.

3. A device as in claim 2, wherein said plurality of electrodes include a first number of electrodes having a first entry electrode and a second number of electrodes having a second entry electrode, wherein said first means includes means for adding to said input signal the weighted signals defined by charges under said first number of electrodes, to produce a first feedback signal and applying said first feedback signal to said first entry electrode, and means for adding to said first feedback signal the weighted signals defined by charges under said second number of electrodes to produce a second feedback signal and applying said second feedback signal to said second entry electrode.

4. A device as claimed in claim 2, further comprising a sample-and-hold circuit for receiving said output signal and delivering under the control of at least one of said clock signals a sampled output signal.

* * * * *